(12) United States Patent
Ionescu et al.

(10) Patent No.: US 8,872,240 B2
(45) Date of Patent: Oct. 28, 2014

(54) ACTIVE MULTI-GATE MICRO-ELECTRO-MECHANICAL DEVICE WITH BUILT-IN TRANSISTOR

(75) Inventors: Mihai Adrian Ionescu, Ecublens (CH); Daniel Grogg, Ecublens (CH)

(73) Assignee: Ecole Polytechnique Federale de Lausanne (EPFL) (CH)

( * ) Notice: Subject to any disclaimer, the term of this patent is extended or adjusted under 35 U.S.C. 154(b) by 0 days.

(21) Appl. No.: 13/129,280

(22) PCT Filed: Nov. 18, 2009

(86) PCT No.: PCT/IB2009/055143
§ 371 (c)(1),
(2), (4) Date: Jul. 13, 2011

(87) PCT Pub. No.: WO2010/058351
PCT Pub. Date: May 27, 2010

(65) Prior Publication Data
US 2011/0298553 A1    Dec. 8, 2011

(30) Foreign Application Priority Data

Nov. 18, 2008  (EP) .................................. 08169367

(51) Int. Cl.
| H01L 29/84 | (2006.01) |
| H03H 3/007 | (2006.01) |
| H03H 9/24 | (2006.01) |
| H03H 9/46 | (2006.01) |
| H03H 9/02 | (2006.01) |

(52) U.S. Cl.
CPC ... *H03H 9/2426* (2013.01); *H03H 2009/02314* (2013.01); *H03H 3/0073* (2013.01); *H03H 9/465* (2013.01)
USPC .................................. 257/254; 257/E29.324

(58) Field of Classification Search
USPC .......................................... 257/254, E29.324
See application file for complete search history.

(56) References Cited

U.S. PATENT DOCUMENTS

2004/0207492 A1* 10/2004 Nguyen et al. ................ 333/199
2007/0176701 A1    8/2007 Nakamura et al.

(Continued)

FOREIGN PATENT DOCUMENTS

| WO | WO 2007/036820 A2 | 4/2007 |
| WO | WO 2007/135064 A1 | 11/2007 |
| WO | WO 2009/076534 A1 | 6/2009 |

OTHER PUBLICATIONS

Grogg D et al.: "Laterally vibrating-body double gate MOSFET with improved signal detection" Device Research Conference, 2008, IEEE, Piscataway, NJ, USA, Jun. 23, 2008, pp. 155-156, XP031436889.

(Continued)

*Primary Examiner* — Matthew Reames
(74) *Attorney, Agent, or Firm* — Sheridan Ross P.C.

(57) ABSTRACT

The present invention exploits the combination of the amplification, provided by the integration of a FET (or any other three terminal active device), with the signal modulation, provided by the MEM resonator, to build a MEM resonator with built-in transistor (hereafter called active MEM resonator). In these devices, a mechanical displacement is converted into a current modulation and depending on the active MEM resonator geometry, number of gates and bias conditions it is possible to selectively amplify an applied signal. This invention integrates proposes to integrate transistor and micro-electro-mechanical resonator operation in a device with a single body and multiple surrounding gates for improved performance, control and functionality. Moreover, under certain conditions, an active resonator can serve as DC-AC converter and provide at the output an AC signal corresponding to its mechanical resonance frequency.

19 Claims, 7 Drawing Sheets

(56) References Cited

U.S. PATENT DOCUMENTS

2009/0009269 A1* 1/2009 Nguyen et al. ............... 333/199
2010/0171569 A1* 7/2010 Ionescu et al. ............... 333/185

OTHER PUBLICATIONS

Grogg D et al: "Integration of MOSFET Transistors in MEMS Resonators for Improved Output Detection" Solid-State Sensors, Actuators and Microsystems Conference, 2007, Transducers 2007. International, IEEE, Piscataway, NJ, USA, Jun. 10, 2007, pp. 1709-1712, XP031216381.

Nguyen C; "MEMS Technology for Timing and Frequency Conrol"; Proceedings, Joint IEEE Int. Frequency Control/Precision Time & Time Interval Symposium, Vancouver, Canada, Aug. 29-31, 2005, pp. 1-11.

International Search Report prepared by the European Patent Office on Apr. 21, 2010, for International Application No. PCT/IB2009/055143.

Written Opinion prepared by the European Patent Office on Apr. 21, 2010, for International Application No. PCT/IB2009/055143.

* cited by examiner

ACTIVE MULTI-GATE MICRO-ELECTRO-MECHANICAL DEVICE WITH BUILT-IN TRANSISTOR

CROSS REFERENCE TO RELATED APPLICATIONS

This application is a national stage application under 35 U.S.C. 371 of PCT Application No. PCT/IB2009/055143 having an international filing date of 18 Nov. 2009, which designated the United States, which PCT application claimed the benefit of Europe Application No. 08169367.3 filed 18 Nov. 2008, the entire disclosure of each of which are hereby incorporated herein by reference.

FIELD OF THE INVENTION

The present invention concerns the field of vibrating micro electro mechanical systems (MEMS) and transistors, in particular the combination of both to improve the performances of MEM resonators.

PRIOR ART AND PRINCIPLE OF THE INVENTION

The present invention exploits the combination of the amplification, provided by the integration of a FET (or similar active device), with the signal modulation, provided by the MEM resonator, to build a MEM resonator with intrinsic signal gain (hereafter called active MEM resonator). Depending on the active MEM resonator dimensions and under certain bias conditions it is possible to selectively amplify an applied signal.

The principle of such device operating in a Double Gate configuration has been fully validated for the first time by the inventors of the present application in a 2008 publication [1], which is incorporated by reference in its entirety in the present application and is in total contrast with the device reported in previous publications [2-5] and the patent application WO 2007/135064 [6], where the gate of a transistor is vibrating, offering key advantages for the intrinsic signal gain, scaling of the device and a larger range of applications. More specifically, in this prior art publication, in all the configurations disclosed, each individual transistor is coupled to a single gate only.

The current device is based on the Single Gate device published in 2007 [7], which is incorporated by reference in its entirety in the present application, and the body of the transistor is the vibrant part. The present invention is however clearly distinct as it uses multiple electrodes to modulate the current in one transistor. The advantages of this configuration over the state of the art are a reduction of the number interconnections needed (simplification of the fabrication), an increase of the electrostatic control on the FET body region and an increase of the resulting current modulation through.

The increase of the electrostatic control on the transistor body can be obtained by more than two gates placed in the same plane, increasing the number of active channels. Furthermore, supplementary gates can be placed in parallel planes below and above, increasing the potential control on one or more channel by coupled action of some or all gates.

Depending on the exact geometry, the type of transistor and its mode of operation, it can be more advantageous to operate the gates in a coupled voltage mode or with independent voltages.

In contrast to the state of the art, the present invention integrates the vertical transistor into the mode shape of the mechanical displacement. As a consequence and unlike the structure presented in WO 2007/135064 [6], a stress may be induced in the channel region of the transistor, which modulates the conductivity of the channel (piezoresistive effect). The effective mass and mobility of the carriers in the channel change with the stress, which is a function of the vibration amplitude and as a consequence, the total current Ids in the transistor is modulated by a combination of the field effect (number of carriers in the channel) and the piezoresistive effect (mobility and mass of the carriers). The stress-component(s) in the channel region may be uniaxial or biaxial (along or perpendicular) to the current flow.

Moreover, the number of interconnections in WO 2007/135064 [6], is higher because each individual transistor is coupled to a single gate only and each has a source and a drain, all needing individual interconnections to the respective contact. The proposed invention reduces the number of contact lines by combining multiple channels into one transistor, thus simplifying the electrical interconnect schematic while maximizing the transistors current modulation capability.

The body of the transistor described in this invention can be surrounded by one or more stacked surface layers (7,7') to control the surface conduction in a similar way to a solid-state-transistor. It is common to use a gate oxide at the channel surface to increase the performance of the transistor. A channel stack (7,7') can include dielectric materials to increase the electrostatic coupling (e.g. high-k materials, . . . ) and conductive materials (metals, silicon, . . . ) to create a floating gate further optimizing the transistor. For some device structures vibrating at very small amplitudes (usually in the order of nm), the dielectric materials can completely close the air-gap, transforming the device into a vibrating transistor with solid-gap.

Other layers in the channel stack (7,7') include surface treatments for sensing applications.

The present invention is not limited to resonators, but extends to resonant and non-resonant embodiments of transistor based motion detection using more than two gates as is useful in the field of MEMS and NEMS sensors (Accelerometers, gyroscopes, . . . ). Such a vibrating body transistor can be used in an open-loop or closed loop configuration, below, at or above its mechanical resonance frequency. Applications of special interest include, but are not limited to hysteretic switches with three or more gates or mechanical memories using a single transistor and more than two gates.

We propose the extension of the vibrating FET principle to any other three-terminal or multi-terminal gated device, where the device body is suspended and vibrates, inducing the modulation of the output current such as:

(i) tunnel FETs (gated pin junction) with vibrating body—in this case the varying electrostatic coupling, at resonance, modulates the tunneling barrier of a silicon. III-V, SiGe or heterostructure tunnel FET with suspended body operated as a reversed bias junction. A strong modulation of the band-to-band (quantum-mechanical) tunneling current can be achieved when the width of the tunneling barrier is modulated by varying field and local strain resulting from the mechanical motion. The conduction mechanism in such vibrating device is completely different from the one in a field effect transistor and the sensitivity to the vibration amplitude is expected to be much higher. This device will also offer better static power consumption compared to a MOSFET and signal gain at voltages and currents much lower than in any MOSFET transistor. Any tunnel FET can be also operated as gate junction in forward mode and current modulation can be also expected.

(ii) impact ionization FET with vibrating body—in an impact ionization MOSFET based on similarly suspended structure where the gate is partially overlapped on a p-i-n junction, operated with reversed bias, the vibration of the device body will locally change the electrical field and/or the stress, which will modulate the impact ionization current.

(iii) gated Zener diodes (gated p+n+ structures) with vibrating body—in a reversed biased gate Zener diode the vibrating body will locally modulate the band-to-band device current, similarly to the description proposed by tunnel FETs.

(iv) vibrating-dot or vibrating-nanowire Single Electron Transistors (SETs)—here we propose two configuration of Single Electron Transistor active resonator where the central dot or nanowire is vibrating by the excitation applied by the gate. In the vibrating dot configuration, the central dot is anchored by two solid-state tunneling junctions to source and drain and excited via capacitive coupling through an airgap by one, two or more surrounding gates. In the SET nanowire configuration, the source and drain tunnel junction transparence (barrier height) can be modulated by the vibrating structure. Moreover, a suspended channel FET can be transformed by vibrations with high amplitude, inducing local tunnel barriers, into a suspended channel SET.

In all these cases the vibrating structure is the device body made on a semiconductor material or made on a hero-structure and many fixed gates can be placed around the device body, being separated from it by air-gap or by solid-gap insulators.

The signal transmission parameters of such devices are well beyond what is currently possible for conventional capacitively transduced passive MEM resonators [8-13], where a change in the resonator to electrode spacing under a constant bias voltage generates a current in both the resonator and the electrode. This current depends on the geometry of the device and is usually rather low. Especially the dependence on the electrode surface makes scaling of capacitive transduced passive MEM resonators difficult without strongly decreasing the signal transmission parameters. Depending on the active MEM resonator and the air gap dimensions, signal gain can be obtained for low voltages (16 V demonstrated) when connected to a state of the art 50Ω RF circuits. Low power consumption of the active MEM resonator is obtained under certain bias conditions (e.g.: sub-threshold operation, low drain voltage) and could be of great interest for low power applications. Further, the multi-gate configuration allows to use the MEM resonator to broaden the tuning range of the signal gain and gives direct control of the output signal phase (0 and π, for positive/negative bias voltages; additionally the phase depends on the mode shape of the resonator).

In one embodiment, an active MEM resonator with signal gain in an open loop configuration is proposed based on the gain provided by the integrated FET. This is interesting for channel selective filtering in RF communications, with low signal levels.

In another embodiment, a mixing filtering technique is proposed making use of either one (two tone signal (LO+RF)) or multiple electrodes (single signal on every electrode, may include drain electrode) to generate the difference or sum of the two applied frequencies. The mechanical response of the resonator directly filters the IF signal.

In one embodiment an oscillator is proposed based on the gain provided by the active MEM resonator. Conventional oscillators use a dedicated amplifier, to compensate for the loss in the resonator, to sustain the oscillation. For active MEM resonators the gain provided by the external amplifier is no longer needed, simplifying therefore the circuit design and reducing the cost.

In a further embodiment, a resonant sensor is proposed based on the active MEM resonator. The current modulation of the active MEM resonator is offering a high robustness to noise and the surface treatment and passivation (for example SiO2) of the active MEM resonator provides electrical isolation and the possibility to add functionalization for bio-sensing applications. SiO2 surface passivation is a standard of FET technology and allows a thermal compensation of the silicon material properties. Surface functionalization is used for resonant sensors: the surface becomes sensitive to one specific particle, which can then be detected.

BRIEF DESCRIPTION OF THE DRAWINGS

FIG. 11(a) Possible design of an active MEM resonator filter, the "inactive" MEMFET input terminal does not influence the drain current and an active MEMFET device used as output. (b) Lumped parameter representation in the mechanical domain of a simple filter function and (c) a schematic of the two mode shapes the system.

FIG. 12(a) Possible spectrum of the mixer operation of VB-FET. (b) Mixer measurement configuration: the signals applied to the gates are: VG1=RF+LO+VDC and VG2=RF+LO−VDC (to compensate for the phase difference) and the output spectrum measured on the drain. (c) Transfer spectrum around the resonance frequency by sweeping LO in a narrow range and memorizing the maximum output power at each frequency: black curve is an overlay of the full-span (40 MHz) spectrum.

DETAILED DESCRIPTION OF THE INVENTION

Figure 1:
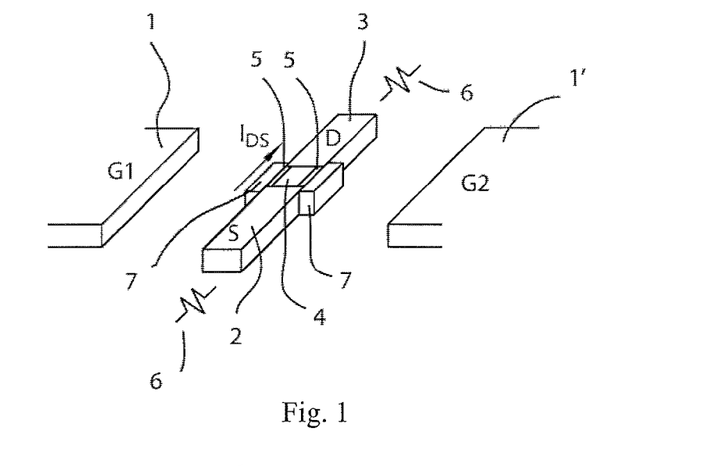
FIG. 1 is a three dimensional view of a flexural active MEM resonator.

1. Active MEM Resonator Device Structure:

A simplified three dimensional drawing is shown in FIG. 1. The gate G1, G2 structures 1 and 1' are laterally placed and fixed with respect to the substrate. A source region 2, a drain region 3 and a low doped body region 4 connecting the source and drain form the active MEM resonator. The channels 5, 5' are formed at the lateral interfaces of the body regions 2, 3 and 4. The active MEM resonator is connected by elastic means 6 to the substrate. Along the channel-to-air gap interface, a possible gate stack 7 can be placed. If the drain and source have the same type of doping (e.g n+ or p+), the structure operates a vibrating FET (enhancement or accumulation transistor: n+-p-n+, p+-n-p+, n+-n-n+, p+-p. p+).

If the drain and the source have opposite dopings and the central part is low doped the structure transforms in a p-i-n junction and can be operated as vibrating tunnel FET (gate overlapped on the central body) or as a vibrating impact ionization MOS (gate partially overlapped on the central body and high reversed drain voltage applied applied).

Figure 2:
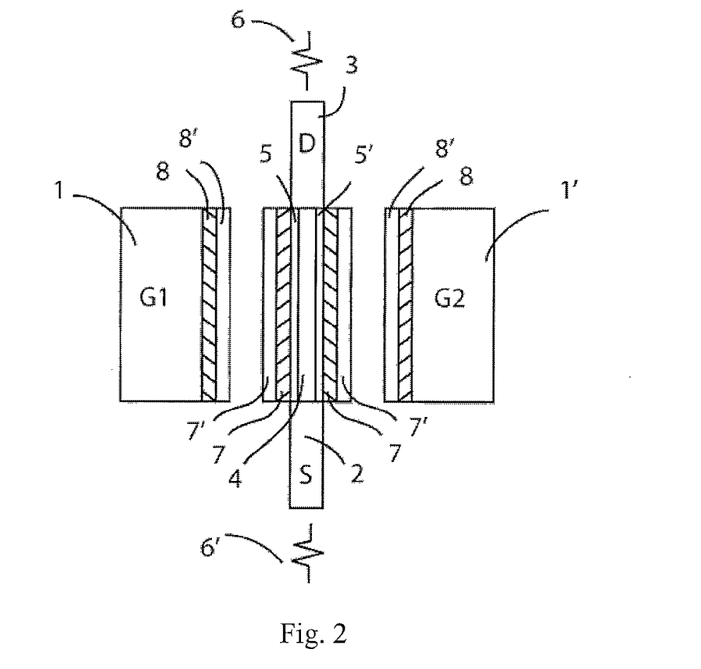
FIG. 2 a more detailed top view of a possible active MEM resonator.

FIG. 2 is a detailed top view of the structure shown in FIG. 1, adding more details about the possible channel stack, which may be placed on one or both sides of an air gap. One or a stack of material 7,7' (e.g. dielectric like silicon dioxide or silicon nitride) is put at channel-to-air gap interface to improve the characteristics of the device at the channel side. Similarly a gate-to-air gap stack 8, 8' may be formed in the same process step, and maybe be made of the same material, or include conductive material to improve the device characteristics. Further, it is possible to fill completely the air gap with material from 8 (and 8') and 7 (and 7') to define a solid gap resonator. The material in the gap serves the purpose of electrical isolation and electrostatic coupling between the gate and the channel. It is advantageous to use a material with a high dielectric constant to increase the electrostatic coupling. A solid gap based MEM device may include the gap and the gate into its motion (intrinsic solid gap) or the solid gap represents a boundary for the motion (external solid gap).

In the latter case, a strong acoustic impedance miss-match decreases the amount of energy radiating from the channel into the gate region.

Figure 3:
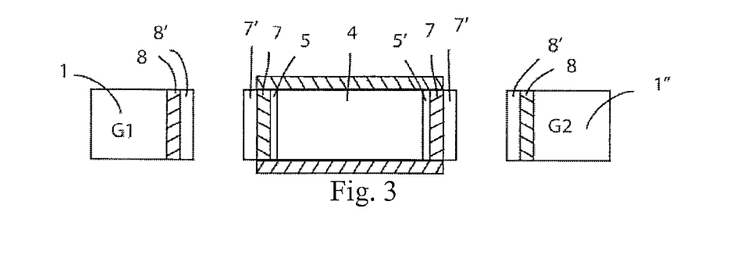
FIG. 3 a more detailed cross-section through the center of the active MEM resonator of FIG. 1.

FIG. 3 is a cross-section of a possible active MEM resonator. The material deposited to improve the interfaces 7, 7' can be deposited in a conformal or a non-conformal way.

Figure 4:
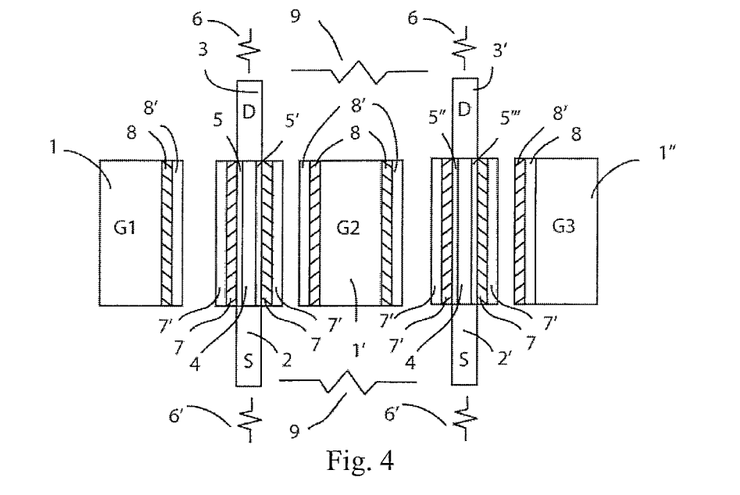
FIG. 4. A possible configuration of an active beam resonator, expanding the number of channels (4 in this figure) and gates (3 in this figure).

The simple structure of FIG. 1 can be extended to a higher number of gates 1, 1', 1" and of channels 5, 5', 5", 5"', as illustrated in FIG. 4, to improve the signal gain by the means of elastic connections 9 of different stiffness, different coupling mode between the channels of the active MEM resonator are possible. This is may be used to create different frequency characteristics (e.g. multi-peak filter or single peak resonator).

Figure 5:
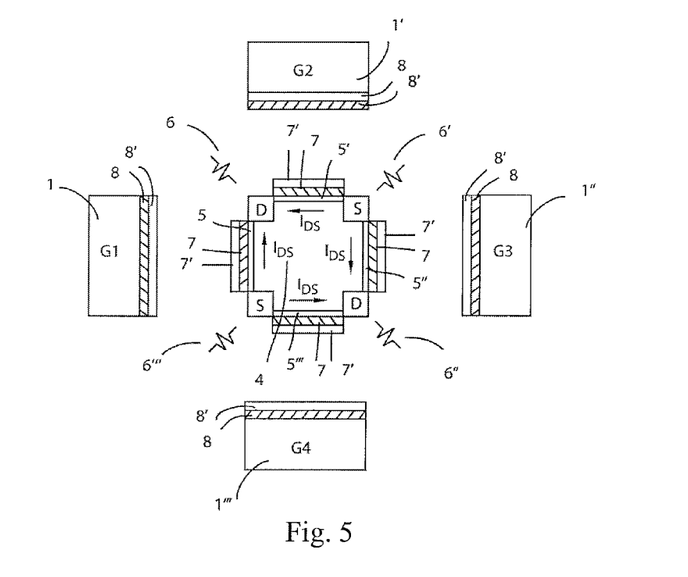
FIG. 5 A top view of a possible bulk mode active MEM resonator in a multi-gate configuration (4 gates/4 channels).

As illustrated in FIG. 5 the active MEM resonator principle can be applied to bulk mode resonator with four gates 1', 1", 1"' four channels 5', 5", 5"' depending on the desired frequency range.

Figure 6:
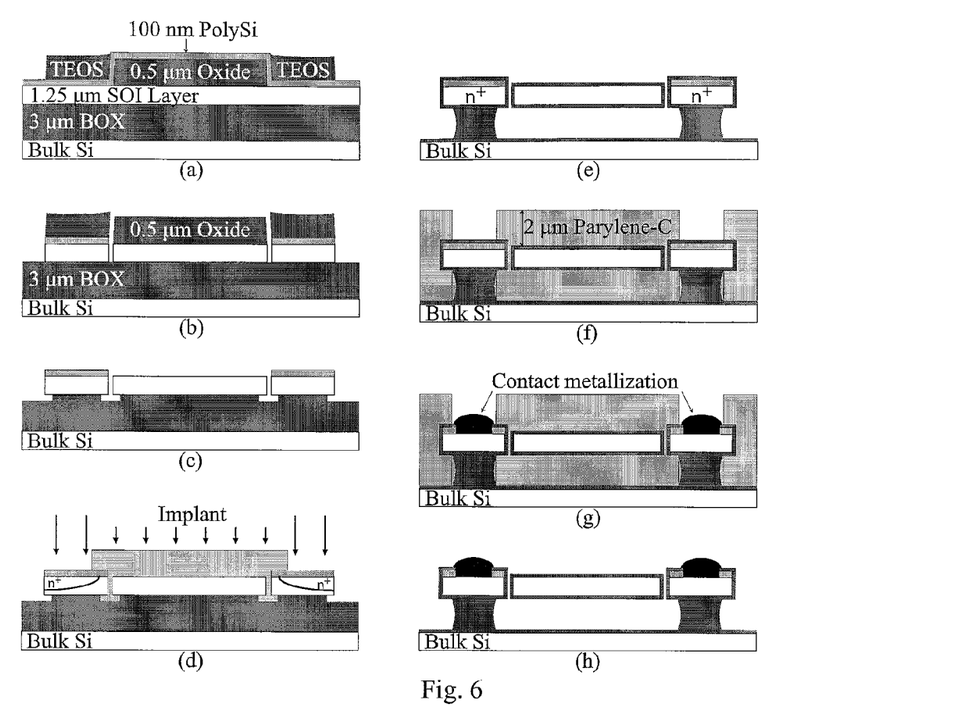
FIG. 6 A possible fabrication process

Other configurations with more gates than illustrated are of course possible in the frame of the present invention. The detection principle can be applied to other resonators using different types of movements, such as flexural or torsional resonators FIG. 6 illustrates a possible fabrication process of the active MEM resonator.
(step a) an etch mask is formed on top of the structural layer used to build resonator.
(step b) The structures formed previously are etched into the structural layer.
(step c) The etch mask is removed.
(step d) A mask for implantation is formed and different regions of the active MEM resonator are implanted to form the source, drain, gate and body regions of the device.
(step e) The dopants are activated, the resonator is released by sacrificial etching of the material below the resonator and the gate stack is formed.
(step f) The released structures are protected with a material during the following step,
(step g) the following contact opening and metallization steps.
(step h) The active MEM resonator is released from the protection material.

Figure 7:
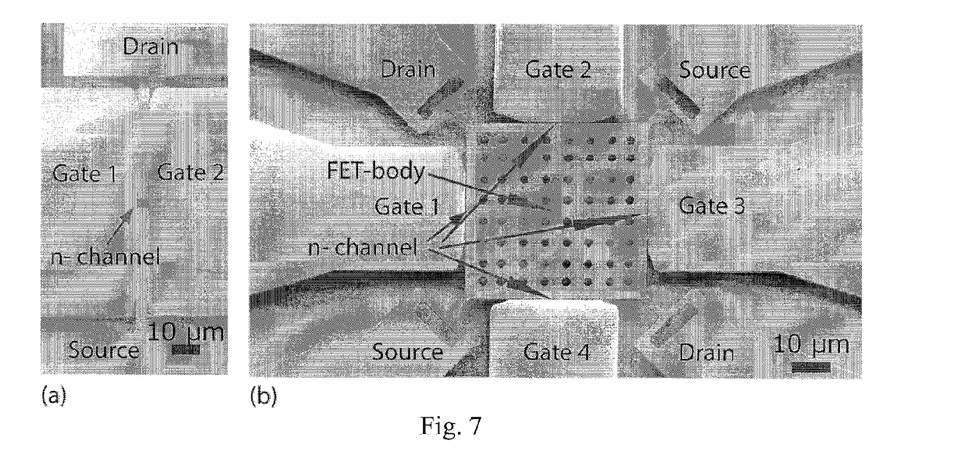
FIG. 7 A SEM image of a fabricated active MEM resonator.

FIGS. 7(a) and (b) are SEM images of active MEM resonators. The one illustrated in FIG. 7(b) is working at a frequency of 71 MHz with four independent gates controlling the inversion charge in the four channels placed on the four lateral sides. The center of the resonator acts a FET body and can be either floating (as seen in FIG. 7) or connected to through one or several anchors to an external voltage source.

Figure 8:
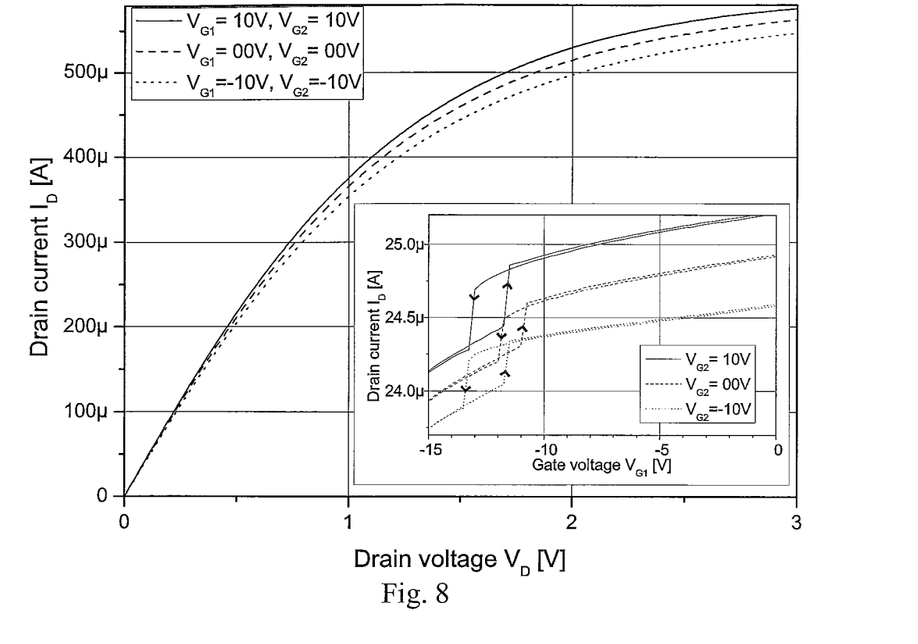
FIG. 8 Experimental static characteristics of an active MEM resonator.

2. Active MEM Resonator Characteristics:

In FIG. 8 the static characteristics measured on an active MEM resonator are depicted. The $I_D V_D$ curve resembles similar curve obtained from conventional CMOS circuits, while the inset shows the $I_D V_G$ characteristics of the same device. The mechanical pull-in and pull-out is clearly visible.

Figure 9:
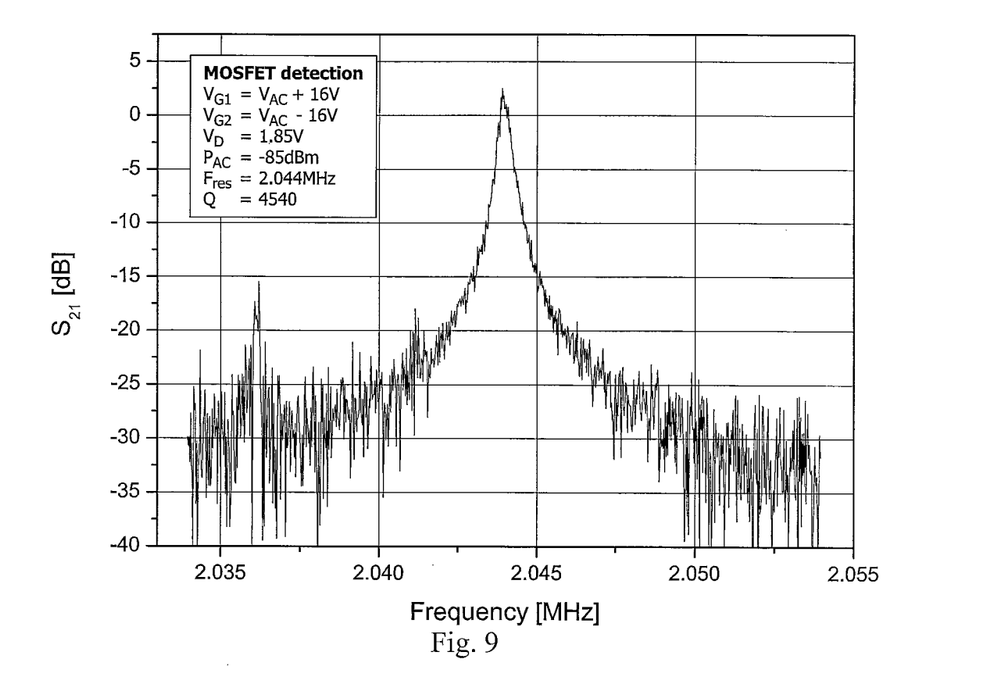
FIG. 9 Experimental transmission scattering parameter of an active MEM resonator.
Figure 10:
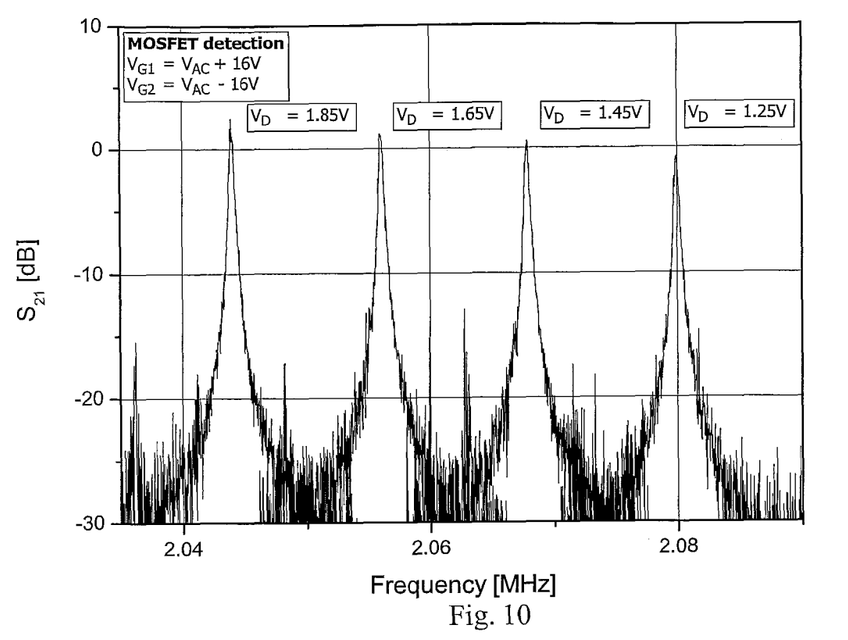
FIG. 10 Experimental transmission scattering parameter of an active MEM resonator with drain voltage as parameter.

A frequency response of an active MEM resonator with a signal gain of approx. +3 dB on a 50Ω input is shown in FIG. 9. As for similar conventional MEM resonator, the frequency is function of the applied voltages, in case of the active MEM resonator all gate and drain voltages influence the resonance frequency. FIG. 10 shows several frequency characteristics of an active MEM resonator for different drain voltages.

Figure 11:
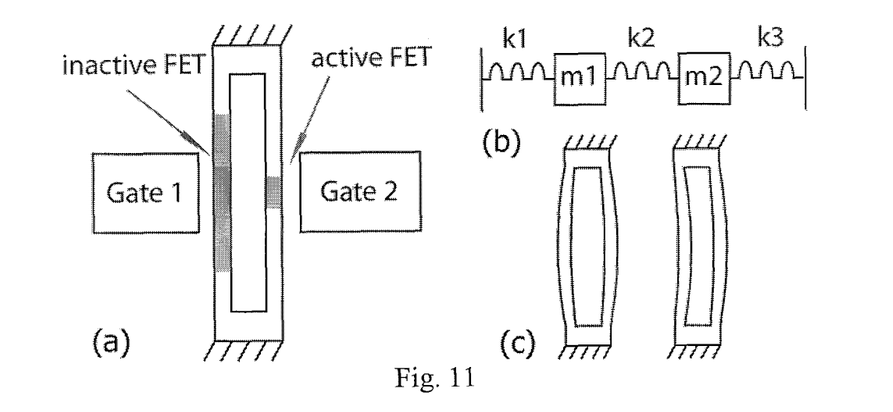
Figure 12:
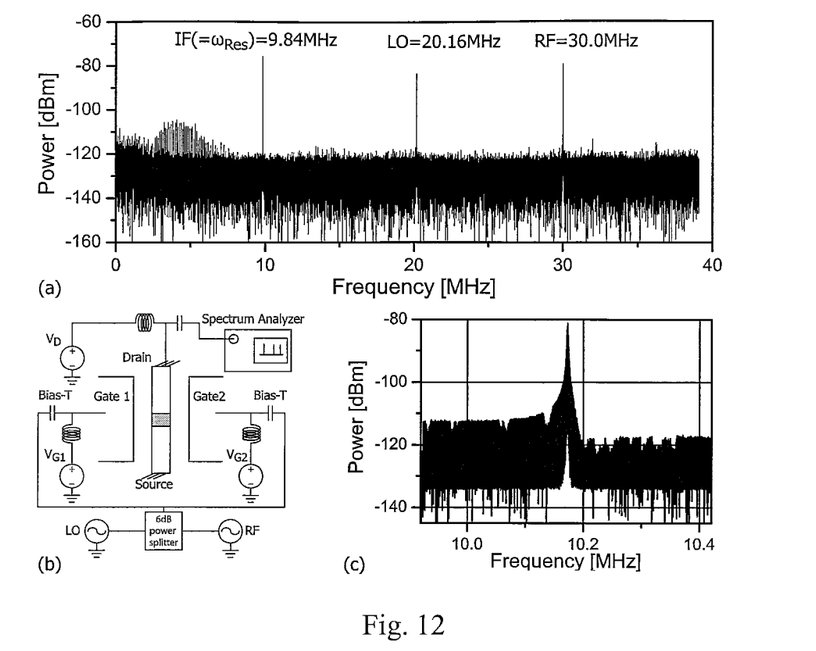

The presence of gain in the current invention is of importance and allows several new architectures and applications. Possible architectures include active filers (FIG. 11), where the filtering and the amplification is achieved with a single device, active mechanical mixer-filters, which include three functionalities (mixing, filtering and amplification) in one device (FIG. 12) and novel oscillator architectures (FIGS. 13 and 14) without the needed for a separate feed-back amplifier. The following architectures (Filter, Mixer-filter, Oscillator) even though greatly benefiting from the gain, can also be realized in a more traditional way using the vibrating body transistor as a highly sensitive device without gain.

3. Filter Architectures:

A possible layout of tuning fork filter based on an active MEM resonator is shown in FIG. 11(a). In the given example the signal is applied on Gate1, which is "inactive", that means it does not contribute to the output current. Such an active filter can be represented by multiple springs and masses, see FIG. 11(b). FIG. 11(c) is a schematic representation of the mode shapes the systems can assume. The active MEMFET is amplifying the input signal in the pass-band of the filter transfer function.

The active MEM resonator filter comprises at least a resonator with a mechanical filter comprising coupled and/or uncoupled active MEM resonators placed in a topology to create the desired filter shape and input/output impedance, achieving signal amplification in the structure. The combination of active and inactive vibrating body FETs increase the design flexibility and are important to achieve a given mode shape in the output current.

4. Mixer Architectures:

The spectrum of an active MEM resonator used as mixer-filter is shown in FIG. 12(a). The setup used for the measurement is shown in FIG. 12(b), where both signals to be mixed (LO and RF) are applied on both gate electrodes. The bias voltage on one of the electrodes is negative, to account for the phase difference between the two channels. FIG. 12(c) is the filter transfer function of the active MEM resonator mixer, memorizing the maximum output at each frequency when sweeping LO in a narrow range. The black curve is an overlay of a part of the 40 MHz spectrum of FIG. 12(a).

In the active MEM resonator mixer-filter configuration, the filter envelope is given by the mechanical design of the active MEM resonator and can be of higher order, compared to the resonator. The mixing occurs when the difference of the two signals (RF and LO) to be mixed corresponds to the resonance frequency (IF) of the resonator. The frequency IF can be generated with different configurations:
(i) RF and LO on the same gate(s),
(ii) RF on the gate(s), LO on the vibrating body,
(iii) RF and LO on separate gates,
making use of surface potential in small vibrating body transistor.

Figure 13:
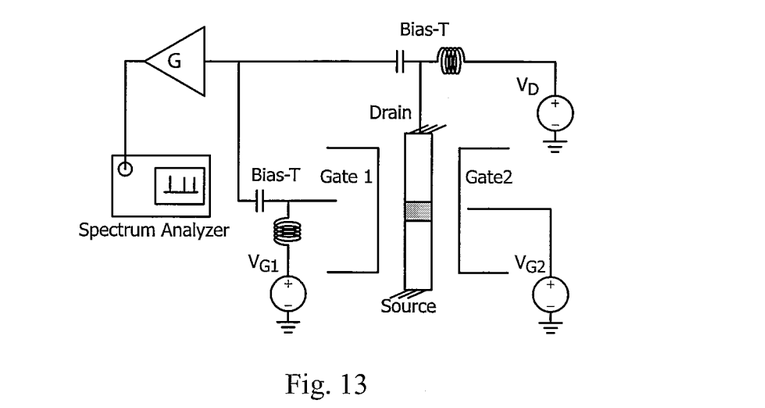
FIG. 13 Possible setup for an oscillator circuit based on the active MEM resonator. An output buffer is drawn in FIG. 7 to drive the signal on the measurement instruments and is not needed for the oscillator operation.

5. Oscillator Architectures:

Depending on the exact realization of the active MEM resonator, different circuits for an oscillator without external amplifier are possible. FIG. 13 shows such a device, were the ac signal generated in the drain current is converted into a voltage signal and feed back to the gate.

Figure 14:
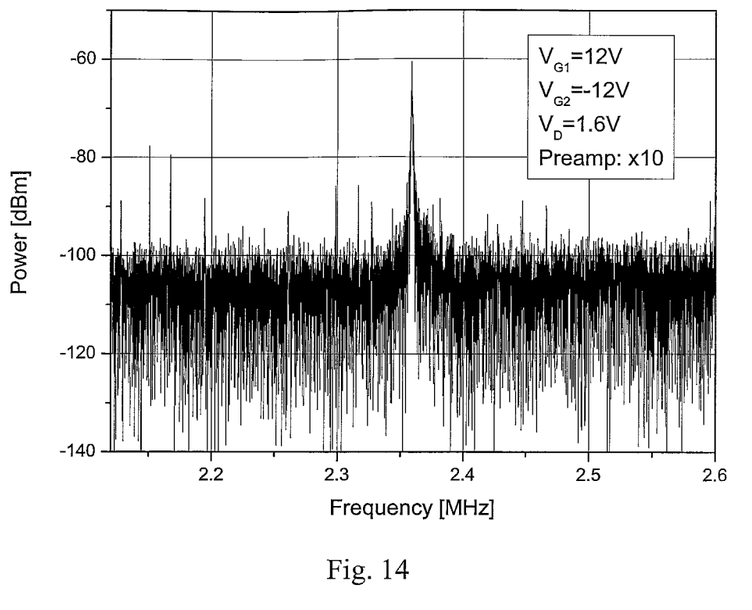
FIG. 14 Spectrum of an active MEM resonator based oscillator.

FIG. 14 the frequency spectrum of such an active MEM resonator based oscillator without external amplifier is shown in FIG. 13.

In an active MEM resonator oscillator, the oscillator circuit loop includes an amplification and/or amplitude control circuit, where the circuit may serve different purposes, such as a reducing the start-up time of the oscillator, limiting the amplitude of the oscillator and/or amplification of the signal to sustain the oscillation.

In one embodiment, the oscillator circuit loop may not include an amplification and/or amplitude control circuit in the signal loop, such that the gain of the active MEM resonator sustains the oscillations. The layout is chosen such that the current signal is converted on a passive element such as the input impedance of the active MEM resonator in a voltage signal and applied on the gate of the active resonator.

In another embodiment, no loop is needed to sustain the oscillation, such that under specific bias conditions, the device starts to self-oscillate without an external excitation, a sustaining amplifier or a loop connection. Such self-oscillation occurs in Vibrating Body FETs with gain and is a simple layout for an oscillator based on an active MEM resonator.

6. Sensor Architectures:

Mass-sensing is given as an example of a resonant sensor based on a active MEM resonator. Due to the current based read-out robust signal processing is possible. The mass sensing can be done with a functionalization layer (FIG. 3, 7') to directly influence the key parameters of the active MEM resonator. The quantity to be analyzed can be frequency, Q, signal gain or a combination of all relevant parameters.

The physical quantity to be sensed can be of different origin (e.g. temperature pressure, acceleration and mass), when its influence on the active resonator resonance frequency or quality factor is known. The internal amplification provides a current based signal, which is robust to noise and other perturbations whereby the interfacing with integrated silicon circuits would be much easier in current detection than in capacitive detection. The surface passivation as described above is important for electrical isolation and bio-sensing applications.

As mentioned previously, SiO2 surface passivation is a standard of FET technology and was the key for the CMOS technology. It is necessary and additionally allows at the thermal compensation of the silicon material properties.

Surface functionalization is used for resonant sensors: in this case, the surface becomes sensitive to one specific particle, which can then be detected.

The sensing of chemicals (molecules in gas or liquids) implies preferably a surface treatment, to ensure a molecule specific detection. Sensing of physical quantities does not need a modification of the device (temperature pressure, acceleration and mass), but the design can be optimized for the given quantity to be measured.

Of course, all the examples given above should be regarded as illustrative and not construed in a limiting fashion. The present invention may be applied to active devices with and without the presence of gain. Also equivalent constructions may be envisaged in the frame of the present invention.

REFERENCES

1. D. Grogg, H. C. Tekin, N. D. Badila-Ciressan, M. Mazza, D. Tsamados, and A. M. Ionescu, "*Laterally vibrating-body double gate MOSFET with improved signal detection*," in Device Research Conference, 2008, pp. 155-156, 2008.
2. N. Abele, R. Fritschi, K. Boucart, F. Casset, P. Ancey, and A. M. Ionescu, "*Suspended-gate MOSFET: bringing new MEMS functionality into solid-state MOS transistor*," in Electron Devices Meeting, 2005. IEDM, 2005, pp. 479-481.
3. E. Colinet, C. Durand, P. Audebert, P. Renaux, D. Mercier, L. Duraffourg, E. Ollier, F. Casset, P. Ancey, L. Buchaillot, and A. M. Ionescu, "*Measurement of Nano-Displacement Based on In-Plane Suspended-Gate MOSFET Detection Compatible with a Front-End CMOS Process*," in International Solid-State Circuits Conference, 2008. ISSCC, 2008, pp. 332-333.
4. C. Durand, F. Casset, P. Renaux, N. Abele, B. Legrand, D. Renaud, E. Ollier, P. Ancey, A. M. Ionescu, and L. Buchaillot, "*In-Plane Silicon-On-Nothing Nanometer-Scale Resonant Suspended Gate MOSFET for In-IC Integration Perspectives*," Electron Device Letters, IEEE, vol. 29, pp. 494-496, 2008.
5. E. Ollier, L. Duraffourg, E. Colinet, C. Durand, D. Renaud, A. Royet, P. Renaux, F. Casset, and P. Robert, "*Lateral MOSFET transistor with movable gate for NEMS devices compatible with "In-IC" integration*," in Nano/Micro Engineered and Molecular Systems, 2008. NEMS, 2008, pp. 764-769.
6. E. Ollier, L. Duraffourg, P. Andreucci, "*Motion sensitive device comprising at least one transistor*", Patent No.: WO 2007/135064 A1, Nov. 29, 2007.
7. D. Grogg, D. Tsamados, N. D. Badila, and A. M. Ionescu, "*Integration of MOSFET Transistors in MEMS Resonators for Improved Output Detection*," in Solid-State Sensors, Actuators and Microsystems Conference, 2007. TRANSDUCERS, 2007, pp. 1709-1712.
8. W. C. Tang, T.-C. H. Nguyen, and R. T. Howe, "*Laterally Driven Polysilicon Resonant Microstructures*," Sensors and Actuators, vol. 20, pp. 25-32, 1989.
9. C. T. C. Nguyen and R. T. Howe, "*CMOS micromechanical resonator oscillator*," in Electron Devices Meeting, 1993. TFDM '93. Technical Digest., International, 1993, pp. 199-202.
10. F. D. Bannon, III, J. R. Clark, and C. T. C. Nguyen, "*High frequency microelectromechanical IF filters*," in Electron Devices Meeting, 1996, International, 1996, pp. 773-776.
11. L. Lin, C. T. Nguyen, R. T. Howe, A. P. Pisano, "*Microelectromechanical signal processor*", Patent No.: WO 94/14240, Jun. 23, 1994.
12. J. R. Clark, C. T. C. Nguyen, "*Micromechanical resonator device has single electrode structure on substrate for electrostatic excitation and current output sensing*", U.S. Pat. No. 6,856,217 B1, Feb. 15, 2005.

13. F. Ayazi, S. Anaraki, G. K. F. Ho, "*Capacitive vertical silicon bulk acoustic resonators*", Patent No.: US 2006/0044078 A1, Mar. 2, 2006.

The invention claimed is:

1. An active micro-electro-mechanical resonator comprising a vibrating body transistor with a source, a drain and a low doped body region connecting the source and the drain, and more than two fixed gates, wherein the transistor cooperates with each gate.

2. A resonator as defined in claim 1, wherein independent channels are formed in the transistor by said gates and wherein said gates act on each channel individually or in a coupled mode on the same vibrating device.

3. A resonator as defined in claim 1, wherein the current modulation in the transistor results from a combination of a piezoresistive effect and a field effect.

4. A resonator as defined in claim 1, wherein the more than two fixed gates are co-planar.

5. A resonator as defined in claim 1, where one or more gates are in a plane parallel to the plane transistor containing the transistor.

6. A resonator as defined in claim 1, wherein the body transistor comprises a channel stack.

7. A resonator as defined in claim 1, wherein the gates comprise a gate stack.

8. A resonator as defined in claim 7, wherein the stacks are made of dielectric.

9. A resonator as defined in claim 1, wherein the vibrating body is fixed through elastic connections of different stiffnesses to enable the resonator to operate in different coupling modes and create different frequency characteristics.

10. A resonator as defined in claim 1, wherein the transistor operates according to at least one of FET, tunnel FETs, impact ionization MOS with a gate partial overlap on the channel of gated p-i-n diode, gated Zener diodes gated p+n+ structures, and vibrating-dot or vibrating-nanowire Single Electron Transistor.

11. A resonator as defined in claim 1, wherein the vibrating body is configured to vibrate perpendicular with respect to the plane containing the resonator.

12. The resonator as defined in claim 1, wherein said gates and said vibrating body transistor are made of at least one of a single crystalline silicon and poly-silicon.

13. A resonator as defined in claim 1, wherein the resonator is configured for use in different operation conditions.

14. A resonator as defined in claim 13, wherein the resonator comprises a thermal oxidation surface treatment to compensate for surface charges.

15. An active MEM resonator filter comprising at least a resonator as defined in claim 1, with a mechanical filter comprising coupled and/or uncoupled active MEM resonators placed in a topology to create the desired filter shape and input/output impedance, achieving signal amplification in the structure.

16. An active MEM resonator mixer-filter comprising at least a resonator as defined in claim 1.

17. An active MEM resonator oscillator comprising at least a resonator as defined in claim 1.

18. An active MEM resonator oscillator comprising at least a resonator as defined in claim 17, where no loop is needed to sustain the oscillation, such that under specific bias conditions, the device starts to self-oscillate without an external excitation, a sustaining amplifier or a loop connection.

19. An active MEM resonator sensor comprising at least a resonator as defined in claim 1.

* * * * *